(12) United States Patent
Tung

(10) Patent No.: US 8,154,346 B2
(45) Date of Patent: Apr. 10, 2012

(54) SHORT CIRCUITS AND POWER LIMIT PROTECTION CIRCUITS

(75) Inventor: Chiayao S. Tung, Cupertino, CA (US)

(73) Assignee: IML International Ltd, Hamilton (BM)

( * ) Notice: Subject to any disclaimer, the term of this patent is extended or adjusted under 35 U.S.C. 154(b) by 0 days.

(21) Appl. No.: 12/938,292

(22) Filed: Nov. 2, 2010

(65) Prior Publication Data

US 2011/0115564 A1    May 19, 2011

Related U.S. Application Data

(60) Provisional application No. 61/259,096, filed on Nov. 6, 2009.

(51) Int. Cl.
*H02H 7/20* (2006.01)
(52) U.S. Cl. .......................... 330/298; 330/291; 330/288
(58) Field of Classification Search .................. 330/298, 330/291, 288
See application file for complete search history.

(56) References Cited

U.S. PATENT DOCUMENTS

| | | | | |
|---|---|---|---|---|
| 4,709,216 A * | 11/1987 | Davis | ............................. | 330/252 |
| 5,384,549 A * | 1/1995 | Araki | ............................. | 330/298 |
| 6,952,091 B2 * | 10/2005 | Bansal | ............................. | 323/277 |
| 7,075,373 B2 * | 7/2006 | Briskin et al. | ................. | 330/298 |
| 7,345,542 B2 * | 3/2008 | Dashtestani et al. | .......... | 330/256 |
| 7,557,660 B2 * | 7/2009 | Tsurumi | ....................... | 330/298 |

* cited by examiner

*Primary Examiner* — Patricia Nguyen
(74) *Attorney, Agent, or Firm* — Sidley Austin LLP

(57) ABSTRACT

In one embodiment, a method includes: detecting one of a short-to-ground condition and a short-to-supply condition at an output node; selectively activating a feedback control transistor according to the detecting; detecting a first current passing through a first transistor using a second transistor sized to be smaller than the first transistor; mirroring the detected current using a plurality of transistors to form a feedback current; and providing the feedback current to a gate electrode of the first transistor according to the selectively activating the feedback control transistor.

17 Claims, 5 Drawing Sheets

SHORT CIRCUITS AND POWER LIMIT PROTECTION CIRCUITS

CROSS-REFERENCE TO RELATED APPLICATION AND CLAIM OF PRIORITY

The present application claims the benefit of priority to U.S. Provisional Patent Application Ser. No. 61/259,096, filed Nov. 6, 2009, entitled, "Short Circuit and Power Limit Protection Circuits," the entirety of which is incorporated by reference herein.

TECHNICAL FIELD OF THE INVENTION

This invention relates to protection circuits, and more particularly, to short circuit and power limit protection circuits used, for example, with output stages.

BACKGROUND

Many electronic circuits use amplifiers or buffers (e.g., unity gain amplifiers) to manipulate or maintain various signals within the circuit. The output of an amplifier or buffer stage is typically connected to provide an output voltage to a load circuit, or to provide circuit isolation via the stage's high input impedance and low output impedance. The design of an output stage may affect various operating aspects of the amplifier or buffer. For example, some amplifiers can deliver a high output current to the load, while others are designed to produce an output voltage swing approximately equal to the magnitude of the circuit's power supply. In other examples, amplifiers are designed to provide output signals with low crossover distortion. In still other examples, amplifiers must maintain gain and stability at relatively high frequencies.

The various operational requirements place constraints upon the design of the output stage. One of the most common output stage designs is that of the class AB amplifier. These output stages are used in a variety of applications including, for example, audio amplifiers and flat-panel display driver circuits. FIG. 1 illustrates a prior art class AB output stage. The output stage of class-AB amplifiers operates by using a current source and a current sink, here complimentary MOSFET transistors $M_1$ and $M_5$. This configuration is sometimes referred to as a "push-pull" configuration since a first branch of the output stage pushes or sources currents to a load while a second branch of the output stage pulls or sinks current from the load. Class-AB amplifiers avoid the high power consumption of a class-A amplifier by always having one output branch substantially turn off when the other output branch is turned on.

The input signal to this stage is applied at nodes $g_1$ and $g_5$, where the signal values rise and fall in the same direction, i.e., the nodes are the same phase. If the output node is accidentally shorted to ground, PMOS transistor $M_1$ sources a great deal of current while NMOS transistor $M_5$ turns off. If, instead, the output node is shorted to the power supply rail $V_{DD}$, NMOS transistor $M_5$ sinks a great deal of current and PMOS transistor $M_1$ turns off. Such shorts can damage or destroy the output stage itself, and/or other circuitry associated with the output stage. Although shorts to $V_{DD}$ or ground are not common during normal operation of the circuit, they can occur during manufacture or testing of devices using the circuit, such as flat-panel displays including one or more integrated circuits with such output stages.

Accordingly, it is desirable to have protection circuitry for output stages such as the class AB output stage of FIG. 1, thereby reducing the likelihood that the circuit is damaged because an output node is shorted to ground or to the power rail.

SUMMARY

According to one embodiment, a circuit comprises a control circuit configured to detect one or more of a short-to-ground condition or a short-to-supply condition at an output node. A first transistor, coupled to the control circuit and controlled by the control circuit, selectively applies a feedback current to a gate electrode of a second transistor. A third transistor, having a gate electrode coupled to the gate electrode of the second transistor, is configured to detect a detected current flowing through the second transistor. A current mirror, coupled to the first transistor and the third transistor, produces the feedback current based on the detected current.

In some embodiments, the control circuit includes an inverter. In some embodiments, the control circuit includes a control transistor having a gate electrode coupled to the output node.

In some embodiments, the second transistor has a second transistor width to length (w/l) ratio, the third transistor has a third transistor w/l ratio, and the second transistor w/l ratio is greater than the third transistor w/l ratio.

In some embodiments, the current mirror includes a plurality of transistors, the third transistor has a third transistor w/l ratio, and at least one of the plurality of transistors has a transistor w/l ratio the same as the third transistor w/l ratio.

In some embodiments, the current mirror includes a plurality of transistors, the second transistor has a second transistor w/l ratio, and at least one of the plurality of transistors has a transistor w/l ratio greater than the second transistor w/l ratio.

In some embodiments, the second transistor is a PMOS transistor coupled between a power supply and the output node. The feedback current increases a voltage on the gate electrode of the second transistor when the short-to-ground condition occurs at the output node.

In some embodiments, the second transistor is an NMOS transistor coupled between the output node and ground. The feedback current decreases a voltage on the gate electrode of the second transistor when the short-to-supply condition occurs at the output node.

In some embodiments, the circuit further comprises a protected circuit including the second transistor. The protected circuit, the control circuit, the first transistor, the third transistor, and the current mirror are each included in a same integrated circuit. In some embodiment, the protected circuit further comprises a class AB output stage.

In some embodiments, the circuit further comprises a fourth transistor coupled in parallel with the third transistor and configured to provide a supply-dependent current. The current mirror produces the feedback current based on the detected current and the supply-dependent current. In some embodiments, the second transistor is a PMOS transistor coupled between a power supply and the output node. The feedback current increases a voltage on the gate electrode of the second transistor when the short-to-ground condition occurs at the output node to provide power limit protection to the second transistor.

In some embodiments, the second transistor is an NMOS transistor coupled between the output node and ground. The feedback current decreases a voltage on the gate electrode of the second transistor when the short-to-supply condition occurs at the output node to provide power limit protection to the second transistor.

According to another embodiment, a method comprises: detecting one of a short-to-ground condition and a short-to-supply condition at an output node; selectively activating a feedback control transistor according to the detecting; detecting a first current passing through a first transistor using a second transistor sized to be smaller than the first transistor; mirroring the detected current using a plurality of transistors to form a feedback current; and providing the feedback current to a gate electrode of the first transistor according to the selectively activating the feedback control transistor.

In some embodiments, the detecting comprises detecting a short-to-ground condition at the output node and wherein the first transistor is a PMOS transistor coupled between a supply rail and the output node. The method further comprises charging the gate electrode of the first transistor according to the feedback current.

In some embodiments, the detecting comprises detecting a short-to-supply condition at the output node and wherein the first transistor is an NMOS transistor coupled between the output node and ground. The method further comprises discharging the gate electrode of the first transistor according to the feedback current.

BRIEF DESCRIPTION OF THE DRAWINGS

For a more complete understanding of the present invention and for further features and advantages, reference is now made to the following description taken in conjunction with the accompanying drawings, in which.

DETAILED DESCRIPTION

Figure 1:
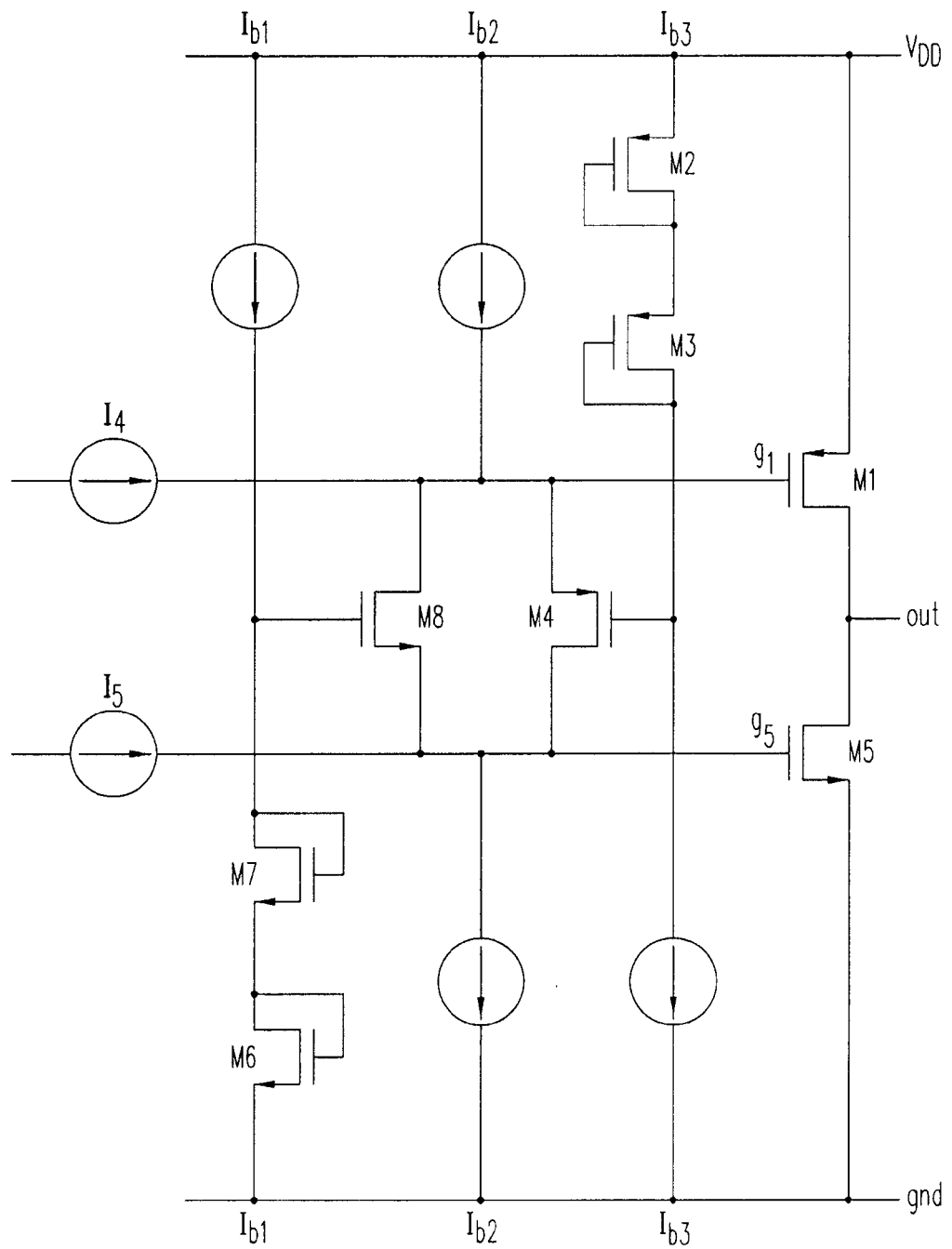
FIG. 1 is a schematic diagram of a prior art class AB output stage.

The embodiments of the present invention and their advantages are best understood by referring to FIGS. 1 through 5 of the drawings. Like numerals and reference characters are used for like and corresponding parts of the various drawings.

Although many of the examples described in the present application will emphasize use in conjunction with class AB output stages, it will be understood by those skilled in the art that these circuits can be used with a variety of output stage designs as desired. Moreover, the protection circuits disclosed herein can be used with both buffering and amplifying output stages, and can be applied wherever such output stages are used including both integrated circuits and discrete circuit designs. Additionally, the present application describes various circuits designed to be integrated with other circuits. Thus, for example, the protection circuits described below are designed to be integrated with the output stage circuits they are used to protect, e.g., flat panel display drivers, and the like.

The circuits of the present application can therefore be implemented using any of a variety of integrated circuit fabrication processes that are suitable for the underlying device. Examples of such integrated circuit fabrication processes include, but are not limited to, BCD (bipolar, CMOS, DMOS) processes, digital CMOS processes, analog CMOS processes, and mixed-signal CMOS processes. BCD processes incorporate, into a single foundry process flow, what are typically three different process types: bipolar, which is used for analog control devices, CMOS (Complementary Metal Oxide Semiconductor) which forms devices that are suitable for the design of both digital and analog circuits, and DMOS (Double Diffused MOS) which is used to form devices that are appropriate for high current output. Similarly, the related BiCMOS foundry process integrates manufacturing technology for forming bipolar devices and CMOS devices on a single die, and can also be used. Numerous other commercial and specialized processes exist that can be used to fabricate one or more of the die. Examples include CMOS variations such as high voltage CMOS, RF CMOS, SiGe—BiCMOS, radiation hardened processes, GaAs specific processes, and the like. Thus, although the circuit examples shown in FIGS. 1-5 rely on CMOS circuit design, the protection circuits can generally be implemented in any of a number of integrated circuit processes.

Figure 2:
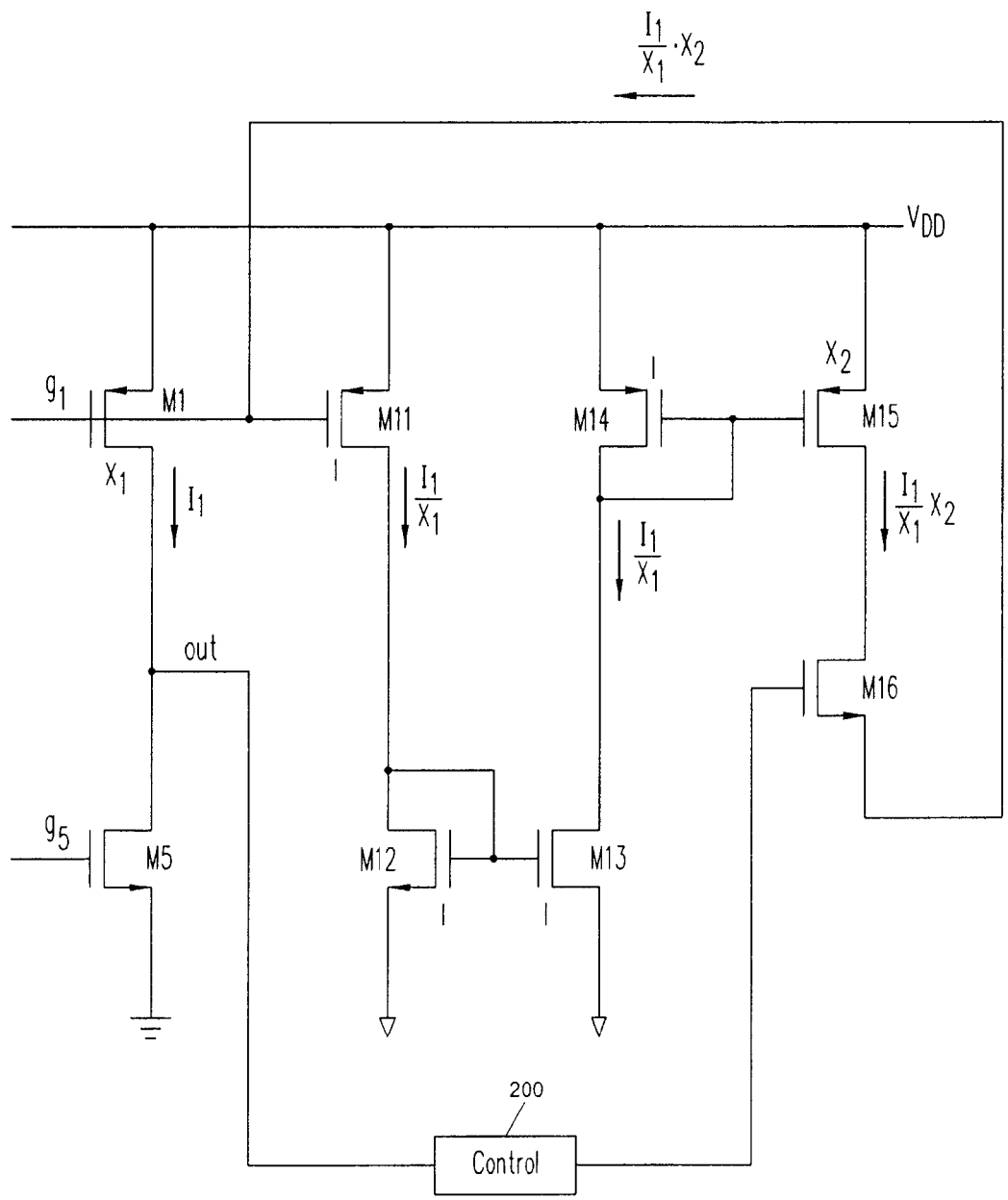
FIG. 2 is a schematic diagram illustrating an example of a current limiting protection circuit for use with the circuit of FIG. 1.

FIG. 2 is a schematic diagram illustrating an example of a current limiting protection circuit for use with the circuit of FIG. 1. Here, a current limit protection circuit for PMOS transistor M1 is shown. Since the circuit of FIG. 2 is designed for current limit protection of PMOS transistor M1, the circuit is primarily designed to detect when the output node is shorted to ground, thereby causing PMOS transistor M1 to source undesirably high amounts of current. The current limit protection circuit includes control circuit 200 for determining when to activate the protection circuit.

In the simplest example, control circuit 200 is an inverter (not shown). Consequently, when the output voltage is at or near zero because of a short to ground, control circuit 200 produces a voltage high enough to turn on NMOS transistor M16, thereby allowing the current developed by the protection circuit to flow back to node $g_1$, i.e., the gate of PMOS transistor M1. In still another example, control circuit 200 includes a PMOS transistor with its gate coupled to the output node, and having its drain coupled to the gate of NMOS transistor M16 and a current source (not shown). When the voltage of the output drops to ground, or at least below the threshold voltage of the added PMOS transistor, the PMOS transistor turns on to force the gate of NMOS transistor M16 to a voltage high enough to turn on NMOS transistor M16.

In general, numerous control circuits 200 can be implemented. Moreover, the control circuits can be designed to have different trip points (e.g., zero volts, $V_T$, etc.), depending on the needs of the protection circuit.

While in operation, the protection circuit of FIG. 2 uses a current mirror to detect the output current $I_1$ flowing through PMOS transistor M1 into the output node. PMOS transistor M11 detects output current $I_1$ and is typically designed to have a smaller gate width and gate length ratio (w/l) than that of PMOS transistor M1. As shown, the size ratio of the two transistors is represented by $X_1$. Thus, $(w/l)_{M1}/(w/l)_{M11}$ is $X_1$, and therefore when output current $I_1$ flows through PMOS transistor M1, the current detected in PMOS transistor M11 is $I_1/X_1$. As will be known to those skilled in the art, the characteristics and performance of many circuits can be designed by changing the sizes (length and width) of the MOSFETs used. Consequently, various different ratios $X_1$ can be used. In one example, $X_1$ is approximately 20,000 such that an output current $I_1$ of 500 mA produces a detected current $I_1/X_1$ of approximately 25 µA. This reduction in current value helps to ensure that the protection circuit is not damaged by high currents. Moreover, it can also result from the desire to fabricate a small protection circuit (e.g., small as compared to other main circuit components) that consumes little power.

Transistors M12-M15 are current mirror transistors used to further develop the current that will be supplied back to the gate of PMOS transistor M1 to adjust its operation in a short-to-ground condition. Again, the respective sizes of the transistors are selected depending on desired circuit operation. In the example of FIG. 2, transistors M11-M14 are designed to have the same size, i.e., w/l ratio. Thus, current flow through PMOS transistor M14 is the same as that flowing through PMOS transistor M11, i.e., $I_1/X_1$. The size of PMOS transistor M15 is selected with respect to the size of PMOS transistor M14 to further develop the feedback current. As illustrated, the ratio $(w/l)_{M15}/(w/l)_{M14}$ is $X_2$, and the feedback current is therefore $(I_1/X_1) \cdot X_2$. In some examples, the sizes of transistors M11-M15 are chosen so that $X_2$ is approximately 2 or 3, but various different relative transistor sizes can be chosen based on design considerations as is well known in the art.

Accordingly, when PMOS transistor M11 detects a higher output current $I_1$, a higher charging feedback current is fed back to node $g_1$ (i.e., the gate of PMOS transistor M1) by the protection circuit, thereby clamping the output node and forcing PMOS transistor M1 to source less current. The short circuit current limit can be adjusted by careful selection, for example, of the size of PMOS transistor M15.

Figure 3:
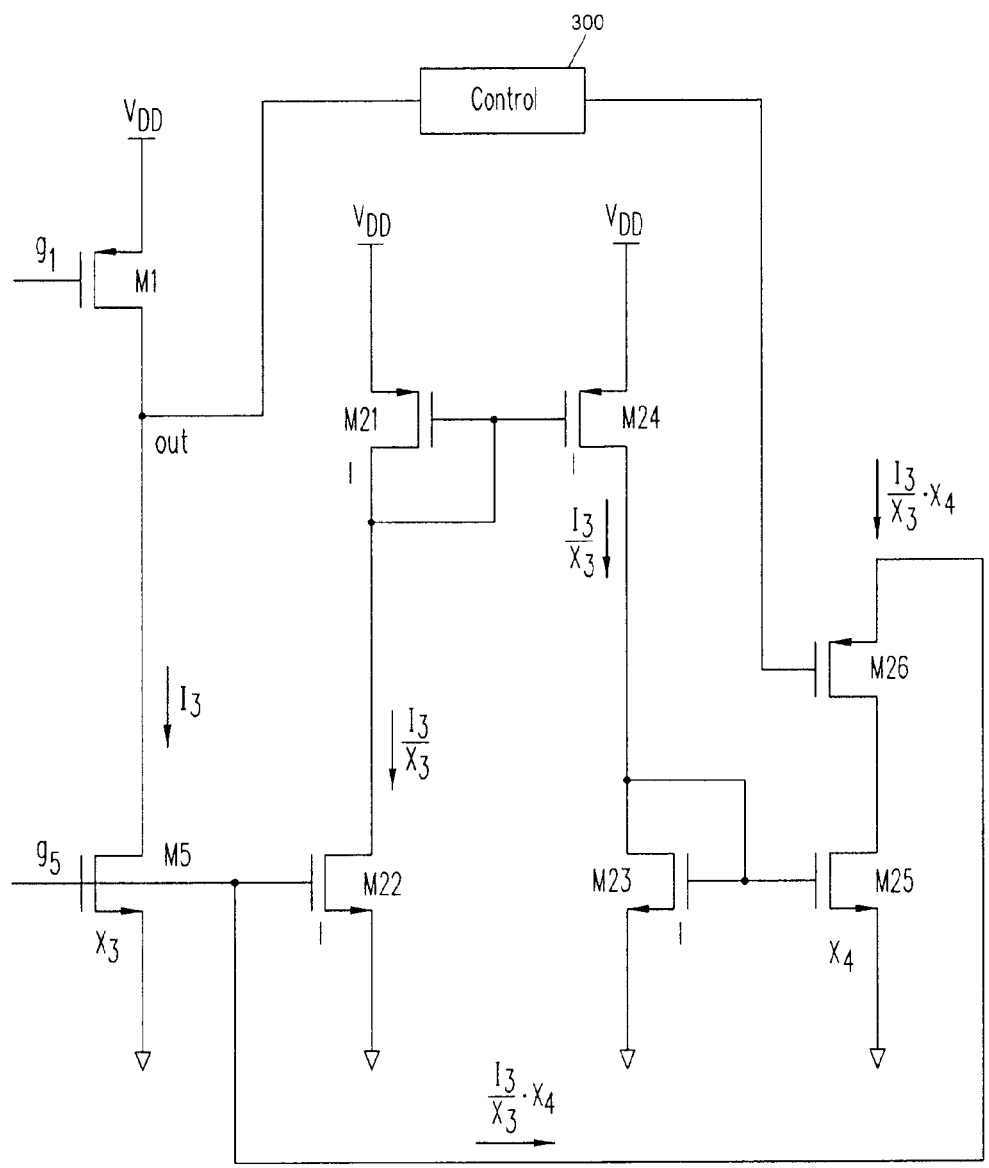
FIG. 3 is a schematic diagram illustrating another example of a current limiting protection circuit for use with the circuit of FIG. 1.

FIG. 3 is a schematic diagram illustrating an example of a current limiting protection circuit for use with the circuit of FIG. 1. Here, a current limit protection circuit for NMOS transistor M5 is shown. Since the circuit of FIG. 3 is designed for current limit protection of NMOS transistor M5, the circuit is primarily designed to detect when the output node is shorted to the power supply rail $V_{DD}$, thereby causing NMOS transistor M5 to sink undesirably high amounts of current. The current limit protection circuit of FIG. 3 includes control circuit 300 for determining when to activate the protection circuit.

Operation of control circuit 300 is somewhat similar to that of control circuit 200, except that control circuit 300 is triggered by a high voltage at the output node (e.g., $V_{DD}$) rather than a low voltage. In the simplest example, control circuit 300 is an inverter (not shown). Consequently, when the output voltage is at or near $V_{DD}$ because of a short to the power supply rail, control circuit 300 produces a voltage low enough to turn on PMOS transistor M26, thereby allowing the current to flow through NMOS transistor M25, discharging node $g_5$ and driving its voltage lower to cause NMOS transistor M5 to sink less current. In still another example, control circuit 300 includes a PMOS transistor with its gate coupled to the output node, and having its source coupled to the gate of PMOS transistor M26 and a current source (not shown). When the voltage of the output node rises to $V_{DD}$, the PMOS transistor turns off to force the gate of PMOS transistor M26 to a voltage low enough to turn on PMOS transistor M26. Numerous other control circuits 300 can be implemented depending on desired trip points, protection needs, and the like.

The protection circuit of FIG. 3 uses NMOS transistor M22 to detect the sink current $I_3$ flowing through NMOS transistor M5 due to the output node short to power supply rail. NMOS transistor M22 detects output current $I_3$ and is typically designed to have a smaller gate width and gate length ratio (w/l) than that of NMOS transistor M5. As shown, the size ratio of the two transistors is represented by $X_3$. Thus, $(w/l)_{M5}/(w/l)_{M22}$ is $X_3$, and therefore when sink current $I_3$ flows through NMOS transistor M5, the current detected in NMOS transistor M22 is $I_3/X_3$. As is the case with the transistors in FIG. 2, characteristics and performance of many circuits can be designed by changing the sizes of the MOSFETs used, and various different ratios $X_3$ can be implemented. In one example, $X_3$ is approximately 20,000 such that a sink current $I_3$ of 500 mA produces a detected current $I_3/X_3$ of approximately 25 µA. This reduction in current value helps to ensure that the protection circuit is not damaged by high currents. Moreover, it can also result from the desire to fabricate a small protection circuit (e.g., small as compared to other main circuit components) that consumes little power. Numerous other examples will be understood by those skilled in the art.

Transistors M21 and M23-M25 are current mirror transistors used to further develop the current used to control the gate of NMOS transistor M5 to adjust its operation in a short-to-supply condition. The respective sizes of the transistors are selected depending on desired circuit operation. In the example of FIG. 3, transistors M21-M24 are designed to have the same size, i.e., w/l ratio. Current flow through PMOS transistor M24 is the same as that flowing through NMOS transistor M22, i.e., $I_3/X_3$. The size of NMOS transistor M25 is selected with respect to the size of transistors M21-M24 to further develop the feedback current. As illustrated, the ratio $(w/l)_{M25}/(w/l)_{M23}$ is $X_4$, and the feedback current is therefore $(I_3/X_3) \cdot X_4$. In some examples, the sizes of transistors M21-M25 are chosen so that $X_4$ is approximately 2 or 3, but various different relative transistor sizes can be chosen based on design considerations as is well known in the art.

When NMOS transistor M22 detects a higher sink current $I_3$, the current drawn through transistors M25 and M26 increases, thereby pulling node $g_5$ lower to turn off NMOS transistor M5 to prevent it from sinking too much current. The short circuit current limit can be adjusted by careful selection, for example, of the size of NMOS transistor M25.

Figure 4:
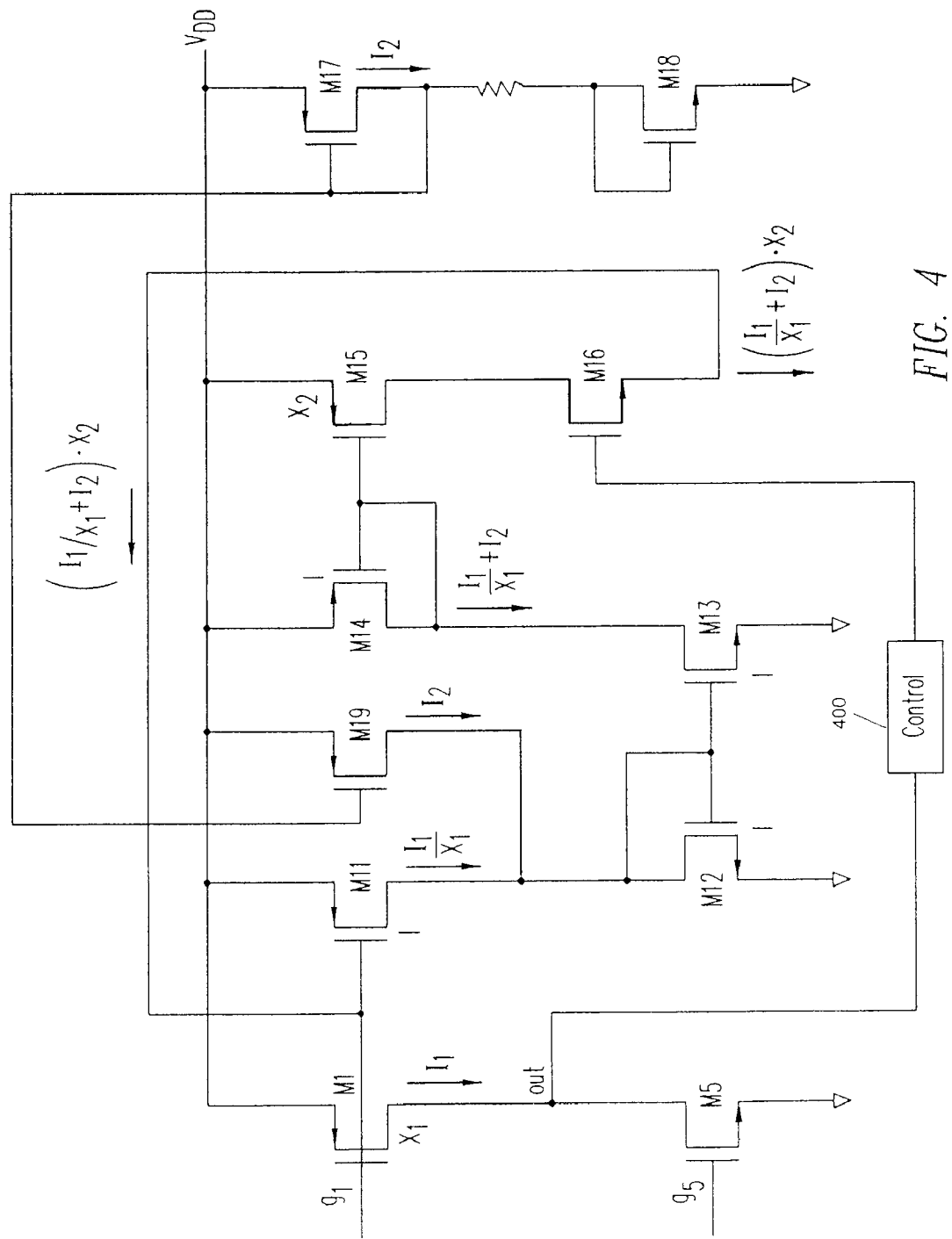
FIG. 4 is a schematic diagram illustrating an example of a power limiting protection circuit for use with the circuit of FIG. 1.

FIG. 4 illustrates an additional protection circuit based on the circuit design of FIG. 2. As with the protection circuit of FIG. 2, this circuit is designed to provide circuit protection in the event the output node shorts to ground. However, instead of providing current limiting protection, the circuit of FIG. 4 is a power limit circuit for protecting PMOS transistor M1, and potentially other circuit components that might be damaged from the high heat associated with an unplanned spike in power consumption. Power limit protection is particularly useful if the short-to-ground of the output node can occur while the supply voltage ($V_{DD}$) is allowed to increase.

In general, control circuit 400 operates the same as control circuit 200 of FIG. 2. Nevertheless, control circuit 400 can be designed with different tripping points in mind, i.e., those tailored to the power limiting function. This protection circuit includes three additional transistors M17-M19 to further develop the feedback current provided to the gate of PMOS transistor M1.

As before, PMOS transistor M11 detects the output current $I_1$ as current $I_1/X_1$. An additional power supply dependent current $I_2$ is provided via PMOS transistor M19. The current $I_2$ is directly dependent on the power supply voltage $V_{DD}$ such that any increase in that voltage causes $I_2$ to increase. The combined current $(I_1/X_1)+I_2$ is mirrored by the current mirror formed using transistors M12-M15. Consequently, the feedback current is now $((I_1/X_1)+I_2) \cdot X_2$.

In operation, as the supply voltage $V_{DD}$ increases, current $I_2$, and thus the total feedback current, increases accordingly. This increased current charges up node $g_1$, pushing the gate voltage of PMOS transistor M1 higher, and thus operating to cause M1 to source less current. By operation of this protection circuit, the power of the circuit under protection is effectively clamped.

Figure 5:
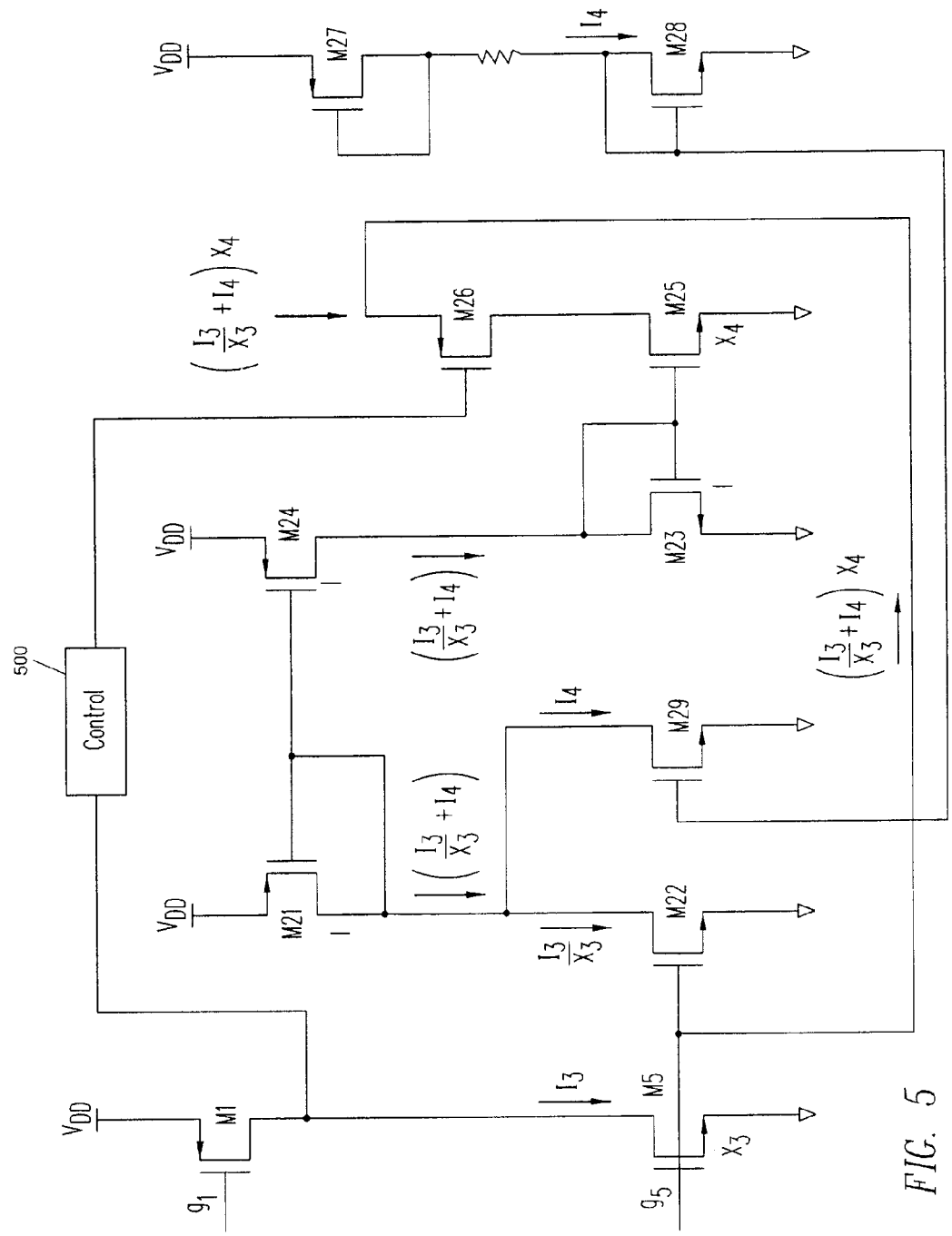
FIG. 5 is a schematic diagram illustrating an example of another power limiting protection circuit for use with the circuit of FIG. 1.

Finally, FIG. 5 illustrates still another protection circuit based on the circuit design of FIG. 3. As with the protection circuit of FIG. 3, this circuit is designed to provide circuit protection in the event the output node is shorted to the power supply rail, and NMOS transistor M5 is forced to sink a large amount of current. However, instead of providing current limiting protection, the circuit of FIG. 5 is a power limit circuit for protecting NMOS transistor M5, and potentially other circuit components that might be damaged from the high heat associated with an unplanned spike in power consumption. Power limit protection is particularly useful if the short-to-supply of the output node can occur while the supply voltage ($V_{DD}$) is allowed to increase.

In general, control circuit 500 operates the same as control circuit 300 of FIG. 3. Nevertheless, control circuit 500 can be designed with different tripping points in mind, i.e., those tailored to the power limiting function. This protection circuit includes three additional transistors M27-M29 to further develop the feedback current drawn from the gate of NMOS transistor M5.

As with the protection circuit of FIG. 3, NMOS transistor M22 detects the sink current $I_3$ as current $I_3/X_3$. An additional power supply dependent current $I_4$ is provided via NMOS transistor M29 (and developed through transistors M27 and M28. The current $I_4$ is directly dependent on the power supply voltage $V_{DD}$ such that any increase in that voltage causes $I_4$ to increase. The combined current $(I_3/X_3)+I_4$ is mirrored by the current mirror formed using transistors M21 and M23-M25. Consequently, the feedback current drawn from node $g_5$ is now $((I_3/X_3)+I_4) \cdot X_4$.

In operation, as the supply voltage $V_{DD}$ increases, current $I_4$, and thus the total feedback current drawn from node $g_5$, increases accordingly. This increased current discharges node $g_5$, pushing the gate voltage of NMOS transistor M5 lower, and thus operating to cause M5 to sink less current. By operation of this protection circuit, the power of the circuit under protection is effectively clamped.

The protection circuits of FIGS. 2-5 are typically integrated with the circuit or circuits they are designed to protect. However, in some embodiments, the protection circuits can be implemented as separate integrated circuits used in conjunction with the circuits to be protected. In still other examples, the various disclosed control circuits can be combined, or a single circuit can be used to control multiple protection circuits. Additionally, the example protected circuit of FIG. 1, is merely one possibility of numerous different types of circuits that can make use of the disclosed protection circuits.

Numerous variations and modifications to the circuits described in FIGS. 2-5 will be known to those having ordinary skill in the art. For example, one or more of the resistors illustrated (or other needed circuit components) can be implemented using a variety of programmable and/or trimable devices. Similarly, the disclosed devices and techniques are not necessarily limited by any transistor, inductor, resistor, or capacitor sizes, capacities, values, or by voltage levels disclosed herein. Moreover, implementation of the disclosed devices and techniques is not limited by CMOS technology, and thus implementations can utilize NMOS, PMOS, and various bipolar or other semiconductor fabrication technologies. While the disclosed devices and techniques have been described in light of the embodiments discussed above, one skilled in the art will also recognize that certain substitutions may be easily made in the circuits without departing from the teachings of this disclosure. For example, a variety of logic gate structures may be substituted for those shown, and still preserve the operation of the circuit, in accordance with DeMorgan's law. Also, many circuits using NMOS transistors may be implemented using PMOS transistors instead, as is well known in the art, provided the logic polarity and power supply potentials are reversed. In this vein, the transistor conductivity type (i.e., N-channel or P-channel) within a CMOS circuit may be frequently reversed while still preserving similar or analogous operation. Other combinations of output stages are possible to achieve similar functionality.

Regarding terminology used herein, it will be appreciated by one skilled in the art that any of several expressions may be equally well used when describing the operation of a circuit including the various signals and nodes within the circuit. Any kind of signal, whether a logic signal or a more general analog signal, takes the physical form of a voltage level (or for some circuit technologies, a current level) of a node within the circuit. Such shorthand phrases for describing circuit operation used herein are more efficient to communicate details of circuit operation, particularly because the schematic diagrams in the figures clearly associate various signal names with the corresponding circuit blocks and node names.

Although the present invention and its advantages have been described in detail, it should be understood that various changes, substitutions, and alterations can be made therein without departing from the spirit and scope of the invention as defined by the appended claims. That is, the discussion included in this application is intended to serve as a basic description. It should be understood that the specific discussion may not explicitly describe all embodiments possible; many alternatives are implicit. It also may not fully explain the generic nature of the invention and may not explicitly show how each feature or element can actually be representative of a broader function or of a great variety of alternative or equivalent elements. Again, these are implicitly included in this disclosure. Where the invention is described in device-oriented terminology, each element of the device implicitly performs a function. Neither the description nor the terminology is intended to limit the scope of the claims.

What is claimed is:

1. A circuit comprising:
    a control circuit configured to detect one or more of a short-to-ground condition or a short-to-supply condition at an output node;
    a first transistor coupled to the control circuit and controlled by the control circuit for selectively applying a feedback current to a gate electrode of a second transistor;
    a third transistor having a gate electrode coupled to the gate electrode of the second transistor, wherein the third transistor is configured to detect a detected current flowing through the second transistor; and
    a current mirror coupled to the first transistor and the third transistor, wherein the current mirror produces the feedback current based on the detected current.

2. The circuit of claim 1 wherein the control circuit includes an inverter.

3. The circuit of claim 2 wherein the control circuit includes a control transistor having a gate electrode coupled to the output node.

4. The circuit of claim 1 wherein the second transistor has a second transistor width to length (w/l) ratio, the third transistor has a third transistor w/l ratio, and the second transistor w/l ratio is greater than the third transistor w/l ratio.

5. The circuit of claim 1 wherein the current mirror includes a plurality of transistors, the third transistor has a third transistor w/l ratio, and at least one of the plurality of transistors has a transistor w/l ratio the same as the third transistor w/l ratio.

6. The circuit of claim 1 wherein the current mirror includes a plurality of transistors, the second transistor has a second transistor w/l ratio, and at least one of the plurality of transistors has a transistor w/l ratio greater than the second transistor w/l ratio.

7. The circuit of claim 1 wherein the second transistor is a PMOS transistor coupled between a power supply and the output node, and wherein the feedback current increases a voltage on the gate electrode of the second transistor when the short-to-ground condition occurs at the output node.

8. The circuit of claim 1 wherein the second transistor is an NMOS transistor coupled between the output node and ground, and wherein the feedback current decreases a voltage on the gate electrode of the second transistor when the short-to-supply condition occurs at the output node.

9. The circuit of claim 1 further comprising:
a protected circuit including the second transistor, wherein the protected circuit, the control circuit, the first transistor, the third transistor, and the current mirror are each included in a same integrated circuit.

10. The circuit of claim 9 wherein the protected circuit further comprises a class AB output stage.

11. The circuit of claim 1 further comprising:
a fourth transistor coupled in parallel with the third transistor and configured to provide a supply-dependent current; wherein the current mirror produces the feedback current based on the detected current and the supply-dependent current.

12. The circuit of claim 11 wherein the second transistor is a PMOS transistor coupled between a power supply and the output node, and wherein the feedback current increases a voltage on the gate electrode of the second transistor when the short-to-ground condition occurs at the output node to provide power limit protection to the second transistor.

13. The circuit of claim 11 wherein the second transistor is an NMOS transistor coupled between the output node and ground, and wherein the feedback current decreases a voltage on the gate electrode of the second transistor when the short-to-supply condition occurs at the output node to provide power limit protection to the second transistor.

14. The circuit of claim 1 wherein each of the first, second, and third transistors are MOSFETs.

15. A method comprising:
detecting one of a short-to-ground condition and a short-to-supply condition at an output node;
selectively activating a feedback control transistor according to the detecting;
detecting a first current passing through a first transistor using a second transistor sized to be smaller than the first transistor;
mirroring the detected current using a plurality of transistors to form a feedback current; and
providing the feedback current to a gate electrode of the first transistor according to the selectively activating the feedback control transistor.

16. The method of claim 15 wherein the detecting comprises detecting a short-to-ground condition at the output node and wherein the first transistor is a PMOS transistor coupled between a supply rail and the output node, the method further comprising:
charging the gate electrode of the first transistor according to the feedback current.

17. The method of claim 15 wherein the detecting comprises detecting a short-to-supply condition at the output node and wherein the first transistor is an NMOS transistor coupled between the output node and ground, the method further comprising:
discharging the gate electrode of the first transistor according to the feedback current.

* * * * *